United States Patent [19]

Apfel

[11] 4,359,609
[45] Nov. 16, 1982

[54] CIRCUIT WITH FEEDBACK FOR CONTROLLING THE IMPEDANCE THEREOF

[75] Inventor: Russell J. Apfel, San Jose, Calif.

[73] Assignee: Advanced Micro Devices, Inc., Sunnyvale, Calif.

[21] Appl. No.: 161,489

[22] Filed: Jun. 20, 1980

[51] Int. Cl.³ .............................................. H04M 3/22
[52] U.S. Cl. ................................ 179/16 F; 179/18 FA
[58] Field of Search ............. 179/16 F, 18 F, 18 FA, 179/77, 81 R, 170.6, 170 NC

[56] References Cited

U.S. PATENT DOCUMENTS

3,731,012  5/1973  Shaffer .......................... 179/16 F X
3,748,395  7/1973  Herter ............................. 179/18 FA

Primary Examiner—Joseph A. Popek
Attorney, Agent, or Firm—Gary T. Aka; J. Ronald Richbourg

[57] ABSTRACT

An impedance control circuit with either current-controlled or voltage-controlled feedback loops in a transmission system. The impedance can be set at desired values, including complex values, and be different at different frequencies. The circuit is particularly useful in subscriber line interface circuits in telephone systems.

38 Claims, 7 Drawing Figures

Fig 7

CIRCUIT WITH FEEDBACK FOR CONTROLLING THE IMPEDANCE THEREOF

FIELD OF THE INVENTION

This invention relates to electrical transmission circuits having impedances controlled by feedback loops and, particularly to subscriber line interface circuits in telephone systems.

BACKGROUND OF THE INVENTION

Electrical transmission systems often require well-controlled impedances. Basically, a transmitting circuit has a signal source which generates a voltage signal which passes through a source impedance to a terminal. The terminal is connected to a second receiving circuit having its own impedance acting as a load impedance to the first circuit. If the system is duplex, i.e., signals will also be transmitted from the second circuit to the first circuit and the roles of the two circuits are reversed, then the load impedance is further connected to a second signal source. In this case, the impedance of the first circuit acts as a source impedance during the transmission of signals from the first circuit to the second circuit and as a termination impedance upon the reception of signals from the second circuit.

In the design of such circuits, various requirements may be imposed upon the impedance of the circuit. It may be desirable that the impedance be well-controlled and accurate or perhaps different at different signal frequencies. A complex impedance having capacitive or inductive characteristics may be required.

Moreover, for the overall design of these circuits, the ease of implementation into integrated circuit form with a minimum of separate components would be a favorable feature, due to the resulting compactness in physical size and good reliability.

Furthermore, if the circuit is a differential one, the suppression of common mode signals would be a likely requirement.

All of these features above are particularly desirable in a telephone system. Such a system has communication carrier channels comprising a pair of unidirectional transmission paths. By an interface circuit located in a telephone office at each end of the channel, the unidirectional paths, one carrying an incoming signal and the other carrying an outgoing signal, are connected to a balanced two-wire, bidirectional transmission path. This bidirectional path forms the subscriber loop to which is connected the subscriber's terminal equipment, such as a telephone hand set.

In the past, the interface circuit has been implemented by so-called transformer hybrid circuits. Due to the need of matching impedances for signal balancing at both the carrier side and the subscriber side by means of transformers, costs of such transformers are high.

Additionally, transformer impedance matching has been with nominal values of impedances for the unidirectional carrier paths and the bidirectional subscriber paths, which has made the performance of the transformer hybrid circuit less than optimum. Another disadvantage of the transformer hybrid has been that the subscriber loop must be supplied with a large DC current to power the subscriber terminal equipment. Since AC signals, such as those of audio frequency, are superimposed upon the DC current for communication to and from the terminal equipment, the transformer in the hybrid circuit must be made to handle the DC current and be responsive to the AC signal. This results in additional costs and size for the hybrid circuits.

Various designs to avoid transformers in hybrid circuits have been made. One such design having current mirror subcircuits has resulted in U.S. Pat. No. 4,004,109, issued Jan. 18, 1977, by F. S. Boxall. However, one disadvantage of the Boxall design is that not only must some of the resistance elements in the circuits be matched, but also the value of these elements must be precisely set, for its proper operation. These requirements raise the manufacturing costs of such a circuit. Furthermore, the Boxall design does not provide for complex impedances for an optimal matching to the transmission paths which nearly always have significant complex impedances.

SUMMARY OF THE INVENTION

These and other problems are overcome or substantially mitigated by the present invention, which comprises a circuit having a feedback loop, either current-controlled or voltage-controlled, by which the impedance of the circuit can be set accurately, easily and to be complex. The invention is very compatible to integrated circuit design using operational amplifiers as the basic building block of the circuit with a minimum of external components.

In a broad aspect the present invention provides for a circuit transferring a voltage signal from a signal source to a second circuit, having a first impedance means for connecting the source to the second circuit, a means responsive to a signal current generated through the first impedance means for generating a feedback current proportional to the signal current, second impedance means responsive to the feedback current for generating a feedback voltage signal related to the feedback current and further related to the signal current, and a means for summing the feedback voltage signal to the voltage signal, the sum of the received voltage signal and the feedback voltage signal generating the signal current, whereby the impedance of said second impedance means with respect to that of said first impedance means determines the impedance of the circuit.

In this manner a current-controlled feedback loop sets impedance of the circuit.

In another aspect of the invention, the second impedance means in the circuit above further has means for filtering out feedback voltage signals outside a predetermined frequency range whereby the impedance of said circuit has one impedance for signals within said predetermined frequency range determined by the impedance of said second impedance means with respect to that of said first impedance means, and another impedance for signals outside said predetermined frequency range determined by the impedance of said first impedance means.

Another aspect of the invention provides for a voltage-controlled rather than a current-controlled feedback loop which sets the impedance of the circuit.

By this invention, described above, a circuit transmitting a signal to a second circuit can have a well-controlled impedance. Also, the circuit allows the possibility of having impedances for different frequency operations, such as that for low frequency (including DC) and AC operation. Furthermore, in a differential system, the differential impedance can be made different from the common mode impedance. Finally, the present invention allows a transmission circuit, such as a subscriber interface circuit, to be designed to have most of its components in an integrated circuit form with a minimum of external components and further permitting the impedance of the circuit to be complex and accurate.

For a more complete understanding of the invention, attention should be directed toward the following detailed description of the invention and the corresponding drawings referred to.

DETAILED DESCRIPTION

Figures 1, 2, 3:
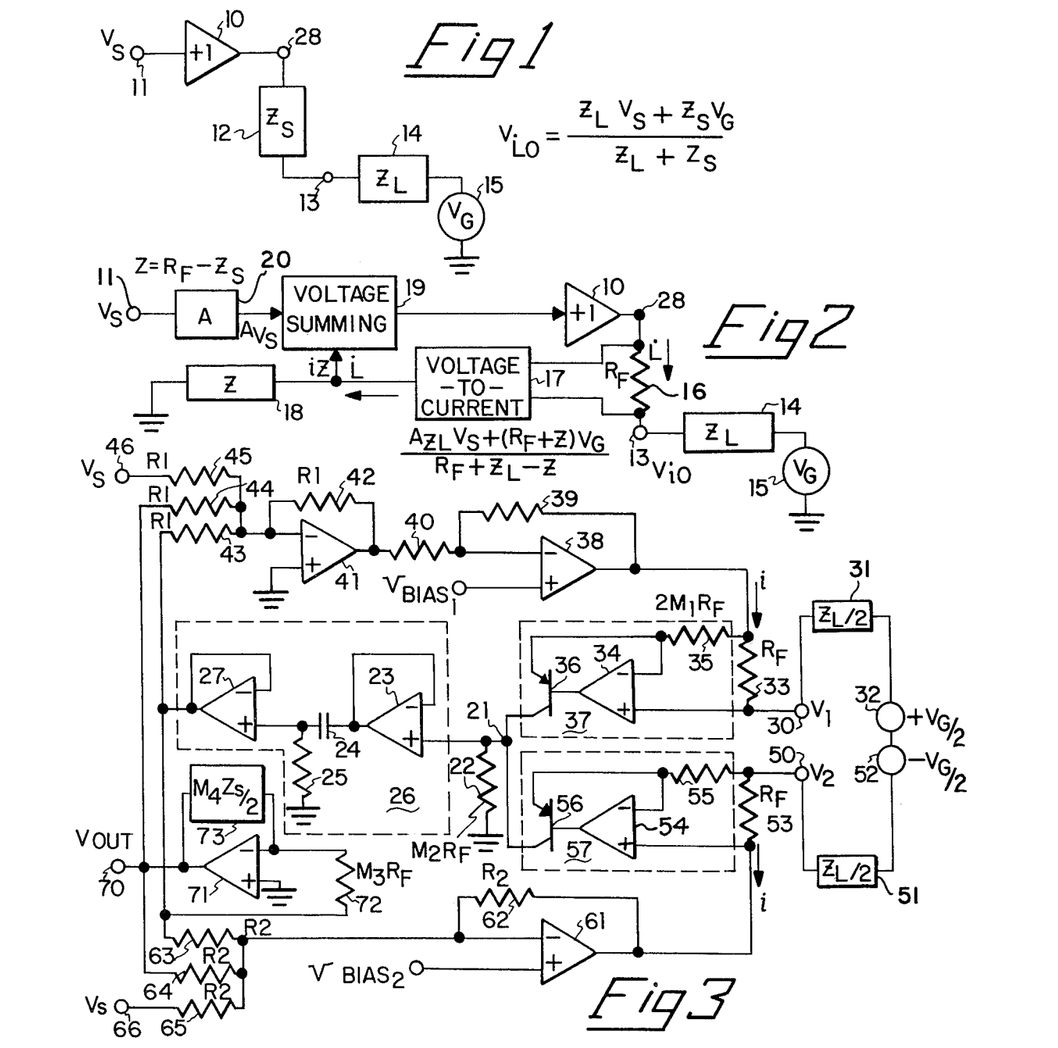
FIG. 1 is a block schematic of two circuits connected for signal transmission illustrating the basic operating principles of the invention.
FIG. 2 is a block schematic illustrating the current-controlled feedback loop for controlling the impedance of one of the circuits according to the present invention.
FIG. 3 is a differential circuit using current-controlled feedback loops for controlling the impedance of the circuit.

A simplified block representation of an idealized transmission system having two circuits along which signals pass from one to the other, is illustrated in FIG. 1. The first circuit has a terminal 11 which receives a voltage signal, $V_S$, from a voltage source (not shown) which becomes the input to an amplifier 10 here shown having a gain of unity so that its output voltage at a circuit point 28 remains unchanged. This voltage signal passes through an impedance element 12 representing the impedance of the first circuit, $Z_S$, to a terminal 13. To the first circuit, the terminal 13 connects a second circuit which has an impedance element 14 representing the impedance of the second circuit, $Z_L$. For a duplex system the impedance element 14 is further connected to a voltage signal source 15 which generates signals, $v_G$, back from the second circuit to the first circuit.

By simple analysis it can be seen that the input/output voltage, $v_{io}$, at the terminal 13 which is the interface between the two circuits is $$V_{io} = \frac{z_L v_S + z_S v_G}{z_L + z_S}$$

The present invention uses a feedback loop in the idealized first circuit in FIG. 1 to control the impedance of that circuit by a single element so that the circuit with the feedback imitates the idealized circuit having impedance, $Z_S$. Moreover, implementation is carried by operational amplifiers connected in the various summing, inverting, amplifying and differential modes, well-known in the art.

FIG. 2 shows a block schematic of a circuit with current-controlled feedback. In this circuit the terminal 11 receives a voltage signal which is amplified by an amplifier block 20 by a factor A. The output of the amplifier block 20 is an input to a voltage summing subcircuit 19, which has its output buffered by the unity gain amplifier 10. In place of the impedance element 12 in FIG. 1 there is substituted a resistance element 16 between the circuit point 28 and the terminal 13. The resistance element 16 has an arbitrary value of $R_F$. A voltage-to-current subcircuit 17 responds to the voltage across the resistance element 16 by two connections at either end of the element. The subcircuit 17 generates a current proportional to the voltage across the element 16 which is, in turn, proportional to the current, i, flowing through the element 16 and terminal 13 into the second circuit having the impedance element 14 and the signal source 15. The feedback current from the subcircuit 17 is assumed to be substantially equal to the current, i, flowing through the element 16. The feedback current passes through an impedance element 18 having a value of z. This voltage, iz, across the impedance element 18 is fed into the voltage summing subcircuit 19. Thus, the output of the amplifier 10 at circuit point 28 is $Av_r + iz$.

Voltage at the terminal 13 becomes $$v_{io} = \frac{z_L(Av_S + iz) + R_F v_G}{R_F + z_L}$$

Knowing that $$i = \frac{v_{io} - v_G}{z_L}$$

and by gathering terms in the numerator for $v_S$ and $v_G$ we have $$v_{io} = \frac{Az_L v_S + (R_F - z)v_G}{R_F + z_L - z}$$

It is usually desired that this circuit with feedback have both source and termination impedances equal to $z_S$ as in the ideal circuit shown in FIG. 1. This imposes the condition that the components of $v_S$ and $v_G$ calculated for the feedback circuit be identical to those calculated for the circuit in FIG. 1. That is, $$\frac{R_F - z}{R_F + z_L - z} = \frac{z_S}{z_L + z_S}$$

$$\frac{Az_L}{R_F + z_L - z} = \frac{z_L}{z_L + z_S}$$

which implies $$A = 1 \text{ and } z = R_F - z_S.$$

By imposing these two conditions upon A and z, the feedback circuit of FIG. 2 has an impedance of $z_S$ as intended. Note that should the feedback current be merely proportional to the current, i, by a factor k, then the impedance of the element 18 can easily be adjusted by the inverse factor 1/k to maintain the impedance of $z_S$ for the circuit.

Since only the element 18 determines the impedance of the circuit it can be constructed separately from the rest of the circuit, which can be manufactured in an integrated circuit form. This allows for making the impedance of the circuit complex with discrete components without disturbing the integration of the circuit.

It should be noted that by setting A not equal to 1, the effective source impedance of the circuit transmitting signals to the second circuit can be made to be different from the termination impedance of the circuit receiving signals from the second circuit. Another way of looking at this case is to say that the transmitted signal has a gain of A and then is transmitted with a source impedance equal to the termination impedance.

By placing a filter circuit between the voltage, $i_Z$, generated by the feedback current across the impedance element 18 and the voltage summing subcircuit 19 it is possible to have two distinct impedances for the circuit at different frequencies. For example, should the filter circuit be chosen to be a high-pass filter allowing through feedback signals only above a predetermined frequency, then the circuit will have an impedance of $z_S$ for signals above the predetermined frequency and a real impedance of $R_F$ for frequencies below the predetermined frequency.

FIG. 3 shows a differential circuit using a current-controlled feedback loop. The second circuit is shown here in a differential form and has an impedance element 31 having an impedance of $z_L/2$ connected to an input/output terminal 30. The other end of the impedance element 31 is connected to a signal voltage source 32 generating a voltage, $v_G/2$, which is connected to a complementary signal voltage source 52 with voltage, $-v_G/2$, connected to an impedance element 51 of $z_L/2$ impedance. The impedance element 51 in turn is connected to the complementary input/output terminal 50. The second circuit forms a loop with a total impedance of $z_L$ and a voltage source having a total differential voltage of $v_G$.

A signal current, i, flows through the loop and a pair of resistance elements 33 and 53 which are connected to terminals 30 and 50, respectively. The current through each element is respectively monitored by a pair of voltage-to-current subcircuits 37 and 57 indicated by enclosing dotted lines.

The voltage-to-current generator subcircuit 37 is comprised of a resistance element 35 having one end connected to one end of the resistance 33. The other end of the resistance element 33 is connected to the positive input of an operational amplifier 34 which has its negative input connected to the other end of the resistance element 35. The output of the amplifier 34 is connected to the base of a transistor 36 which has its emitter connected in a feedback relation to the negative input of the amplifier 34. The resistance of the element 35 controls the amount of current which is generated from the collector of the transistor 36. This can be seen by noting that the voltage across the element 33 is the same as that which occurs across element 35 since the input voltage of an operational amplifier are equal to a first order approximation. Since current does not flow in nor out of an operational amplifier, the current across the element 35 flows into the emitter and out from the collector of the transistor 36. To a good approximation the current generated from the collector of the transistor 36 is the same as that flowing into its emitter.

Note for definitional purposes that the transconductance of the converter subcircuit 37 is equal to the conductance, the inverse resistance, of the resistance element 35.

The element 35 is chosen to have a value $2M_1$ times that of the element 33, i.e., $2M_1 R_F$. Thus, a feedback current is generated from the subcircuit 37 having a value of $i/2M_1$.

The subcircuit 57 is identically constructed and a feedback current of equal magnitude and direction toward the circuit point 21 is generated. The sum of these two feedback currents is equal to the loop current $i/M_1$ which is fed through a resistance element 22 connected at one end to ground. The element 22 is chosen to have a resistance related to that of the elements 33 and 53 by a factor $M_2$. Thus, a voltage of $iR_F M_2/M_1$ is generated.

This voltage is then fed into a filter circuit 26 enclosed by a dotted line and having buffering operational amplifiers 23 and 27 and an RC circuit with a capacitance element 24 and resistance element 25. The value of the elements 24 and 25 are chosen to allow predetermined frequency signals to pass through and to block any other signals.

This filtered feedback voltage signal $iR_F M_2/M_1$ is fed into two summing voltage amplifier circuits belonging to each leg of the differential circuit. If $M_2/M_1 = 1$, then this output is equal to $iR_F$.

The filtered feedback voltage signal is amplified and inverted by an operational amplifier 71. The filtered voltage signal is fed into the negative input of the amplifier 71 through a resistance element 72 having a value of $M_3 R_F$. The output of the amplifier 71 is connected to its negative input through an impedance element 73 having a value of $$\frac{M_4 z_S}{2}.$$

The amplification factor is thus $$\frac{M_4 z_S}{2 M_3 R_F}$$

and the output of the amplifier 71 is the filtered component of the signal, $$-\frac{i z_S M_2 M_4}{2 M_3 M_1}.$$

This output is also connected to the summing amplifier of each leg of the circuit. If $$\frac{M_2 M_4}{M_1 M_3} = 1,$$

this output is to $$-\frac{i z_S}{2}.$$

The output of the amplifier 71 is also connected to a terminal 70 through which signals $V_{out}$, originating from the loop are transmitted to the external world. The signal, $V_{out}$, is the same as the desired differential signal, $V_1 - V_2$, except that the component for $V_S$ is inverted. This can be compensated for and in a telephone system would be compensated by a transhybrid balancing circuit.

The voltage signal from a signal source enters each leg of the differential circuit through a pair of terminals 46 and 66 respectively. To the received voltage signal in each leg there are added filtered feedback voltage directly from the filter subcircuit 26, iRF, and the amplified feedback voltage from the amplifier 71, $-iz_S/2$. Voltage summing is carried out by an operational amplifier 41 connected in a voltage summing configuration in which each of the voltages to be summed are connected by input resistors 45, 44, and 43 to the negative input of the amplifier 41. A feedback resistance elememt 42 connects the output of the amplifier 41 to the negative input of the amplifier 41. It has the same value as the input resistance elements to keep the gain of the signals in this leg of the differential circuit equal to unity. Accordingly, an operational amplifier 61 is similarly arranged in a summing mode with equal input resistance elements 63, 64, and 65, and feedback resistance element 62.

In the differential circuit two out of phase signals will sum to create an effective gain of 2. Therefore, in this circuit a factor of $iz_S/2$ is used rather than $iz_S$. Moreover, to be adapted to a telephone system, the A factor for the $V_S$ signal received is effectively set to 2 rather than 1 because most telephone systems desire a +6dB gain from the terminals 46, 66 to the terminals 30 and 50 to compensate for the telephone line attenuation. This factor can be adjusted for any gain or loss by modifying elements 45 and 65.

The first leg of the circuit has an additional operational amplifier 38 connected in an inverting mode by having a feedback resistance element 39 equal to an input resistance element 40. The inversion of the output signal of amplifier 41 by the amplifier 38 serves to differentiate the polarity of the signals in each leg of the differential circuit.

Alternatively, the two summing amplifiers 41, 61 can be replaced by a single summing amplifier. The output of the single amplifier is divided into two, an uninverted portion and an inverted portion. The uninverted portion, the direct output of the single summing amplifier, drives one leg of the differential circuit. The inverted portion, the output of the single amplifier inverted by the inverting amplifier 38, drives the other leg of the circuit. The circuit in FIG. 3 operates in the same way as discussed previously.

A calculation of the output voltages of the amplifier 38 shows that the voltage is $$[v_S + i(R_F - z_S/2)]$$

and the output voltage of the amplifier 61 is $$-[v_S + i(R_F - z_S/2)]$$

It can be seen from the general relationship derived for the equation of FIG. 2 that the impedance of the circuit as a voltage source to the loop having a total impedance of $z_L$ is given by $z_S$ with $V_S$ having an effective gain of 2. Thus, the single impedance element 73 fixes the impedance of the circuit for signals having frequencies passing through the filter circuit 26.

Two bias voltages, $V_{Bias1}$ and $V_{Bias2}$, are applied to the positive inputs of the amplifier 38 and 61. This does not affect the operation of the circuit as discussed above, but allows a DC current to be added to the signal current, i. This feature is useful in a telephone system which requires subscriber lines to be supplied with DC current.

This circuit is well-adapted as an interface circuit to the subscriber bidirectional paths in a telephone system. Signals originating from the incoming unidirectional path of the communication carrier channel can be effectively transferred to the subscriber line loop which is represented by the second circuit in FIG. 3. Similarly signals originating from the subscriber line can be efficiently received by the circuit. This is true since the circuit can be easily set to have an impedance matching that of the subscriber loop circuit. Only the single element 73 sets the impedance of the circuit; there is no need of matching external components. Moreover, since it is the ratio of the resistance of the element 72 to the impedance of element 73 which affects the circuit, both elements are scaled upward in value by an arbitrarily large factor $M_4$.

Another benefit is that the circuit can be designed so that the impedance element 73 can be connected separately with the rest of the circuit which will be an integrated circuit form. Thus, the element 73 can be complex with capacitive and inductive characteristics besides that of resistance. The rest of the circuit is well-suited for manufacture as an integrated circuit form since the circuit now only requires the matching of resistive elements, such as elements 33 and 53, and elements 35, 55, and 22, for example. Integrated circuits are particularly well-suited for resistance matching.

Besides permitting impedance matching, the circuit can have other impedances at different frequencies by means of the filter subcircuit 26. For interfacing with a subscriber loop circuit, an optimal design sets the subcircuit 26 to allow through audio frequency signals and to block DC signals. Instead of the impedance element 73, the resistance elements 33 and 53 determine the resistance of the circuit to be $2R_F$ for DC signals. The circuit can supply the subscriber loop with DC current to power the subscriber terminal equipment without unnecessarily high resistance values in the circuit. The element 73 is set to match the impedance of the subscriber loop, and elements 33 and 53 are set low for minimal power dissipation by the DC feed current to the subscriber loop. It should be noted that the circuit is particularly compatible to a novel DC power feed circuit especially useful for the current supply of subscriber loops for which a companion U.S. patent application, Ser. No. 161,490, entitled "Current-Controlled Battery Feed Circuit", by the present inventor has been filed on the same data as the present application.

The current-controlled circuit is also excellent in rejecting longitudinal mode signals. These signals appear in the subscriber loop due to interference from neighboring transmission lines, for example. Longitudinal mode signals appear in the circuit as opposing feedback current components from the feedback current generator subcircuits 37 and 57. The components cancel and the longitudinal mode signal is rejected.

Figures 4, 5:
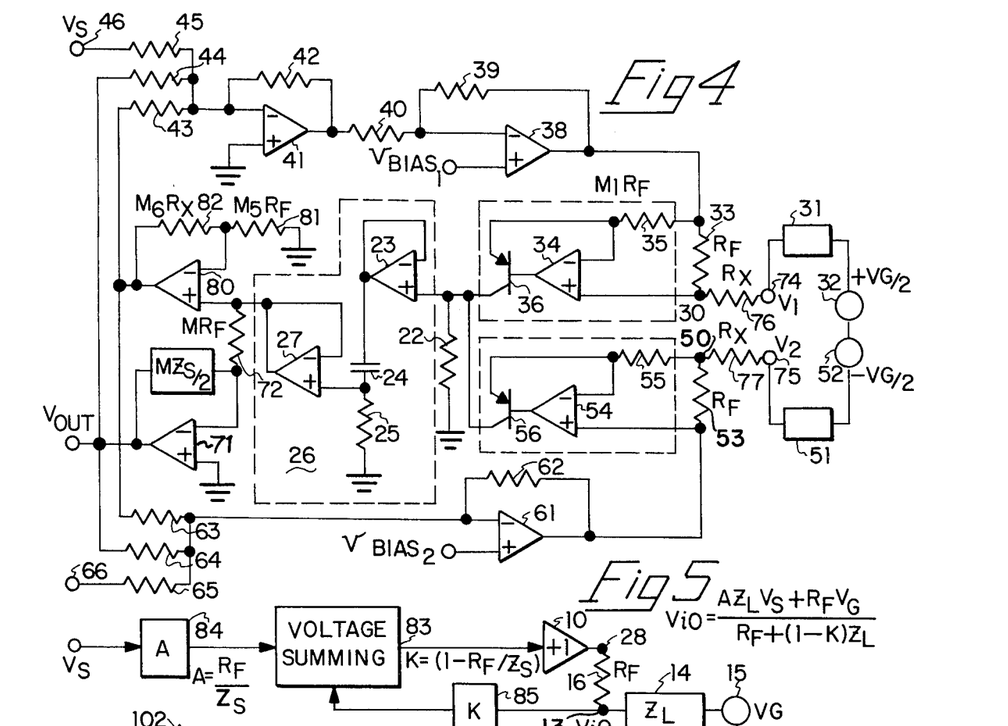
FIG. 4 illustrates a circuit similar to that in FIG. 3, having added series limiting resistors for overvoltage protection and an additional operational amplifier unit to compensate for the additional resistors.
FIG. 5 is a block schematic according to the present invention having a voltage-controlled feedback loop for impedance control.

Finally, the current-controlled feedback circuit permits the use of external series limiting resistors, shown in FIG. 4 as a resistance element 76, having value $R_x$, connected between the terminal 30 and the terminal 74, and a resistance element 77 of value $R_x$ also, connected between the terminal 50 and the terminal 75. Such resistances are used to protect the circuit from sudden sources occurring in the subscriber loop such as those caused by lightning or a short circuit. These surges of high current pass through the resistance elements 76 and 77 which are designed to quickly burn out before such injurious surges reach the circuit proper. Some-times connected with series limiting resistances are clamping circuits (not shown) which aid in the prevention of sudden surges in voltages.

The present circuit allows for an easy accommodation of the addition of these external elements. This is done by adding an operational amplifier 80 amplifying the filtered feedback voltage to the original circuit of FIG. 3. The negative input of the amplifier 80 is connected to ground through a resistance element 81 having a value of $M_5R_F$. The negative input is also connected to the amplifier output through a feedback resistance element 82 having a value of $M_6R_F$. This results in an output voltage of the amplifier 80 of $i(R_X+R_F)$ if $M_5=M_6$, which is fed into the summing amplifiers 41 and 61 of each leg of the differential circuit. By this modification, the differential circuit compensates for the addition of these external resistance elements 76 and 77 by making the impedance of the circuit at the interface of the terminals 30 and 50 appear to be $z_S-2R_X$ such that the impedance at the interface of the terminals 74 and 75 is equal to $z_S$. Effectively the interfacing terminals with the subscriber loop now are the terminals 74 and 75. Furthermore, the design of the circuit can be easily implemented since the resistance element 82 can be left external and is scaled by a factor of N.

Up to now, discussion has centered around circuits having a current-controlled feedback loop. FIG. 5 shows a simplified version of a voltage-controlled feedback loop for controlling the impedance of the circuit. By following the same analysis for the circuit in FIG. 5 and comparing it to the ideal characteristics of FIG. 1, it can be determined how to control the impedance of the circuit by a voltage feedback.

The input/output terminal 13 interfaces with a second circuit having an impedance 14 and a voltage source 15 as before. The received voltage signal, $v_S$, is amplified by a factor A, by means of an amplifier block 84 whose output is sent into a voltage summing subcircuit 83. The received voltage signal is passed along by the unity gain amplifier 10 through the resistance element 16 having a value of $R_F$. The voltage, $v_{io}$, at the input/output terminal 13 is fed back into an amplifier subcircuit 85, having an application factor K, the output of which is also fed into the voltage summing subcircuit 83. The voltage at the input/output terminal 13, $V_{io}$, is $$\frac{z_L(Av_S + Kv_{io}) + R_Fv_G}{R_F + z_L}$$

By some manipulation $$v_{io} = \frac{Av_Rz_L + R_Fv_G}{R_F + (1-K)z_L}$$

As before, we desire the components of $v_S$ and $v_G$ to be equal to those components in the ideal system in FIG. 1. This means that $$\frac{R_F}{R_F + (1-K)z_L} = \frac{z_S}{z_L + z_S} \text{ and}$$

$$\frac{Az_L}{R_F + (1-K)z_L} = \frac{z_L}{z_L + z_S}.$$

This implies that $K=(1-R_F/z_S)$ and $A=R_F/z_S$.

Figure 6:
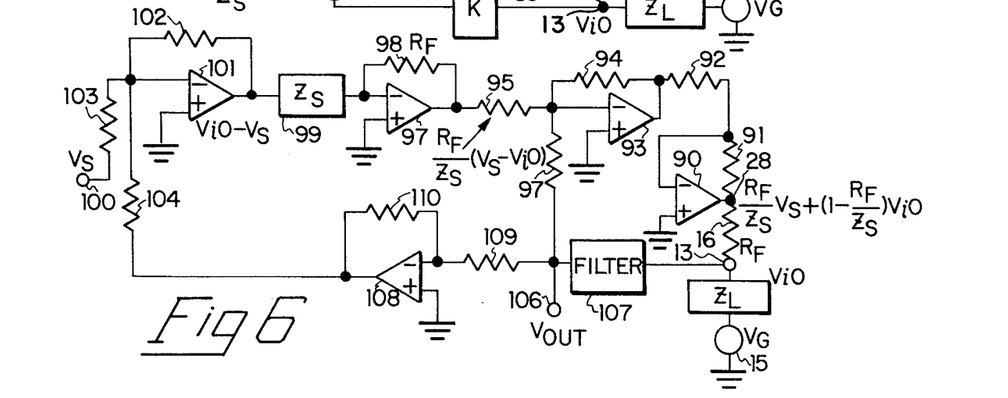
FIG. 6 shows a circuit having a voltage-controlled feedback loop for controlling the impedance of the circuit.

FIG. 6 illustrates a circuit which implements the above requirements. A terminal 100 accepts the voltage signal, $v_S$, which is passed through a summing operational amplifier 101. The output voltage of the amplifier 101 is then amplified by an amplifier 97 by a factor of $-R_F/z_S$ with an input impedance element 99 having a value $z_S$ and a feedback resistance element 98 with value $R_F$. From the output of the amplifier 97, $R_F/z_S$ $V_S$ passes to the circuit point 28 unchanged since the signal passes through a summing mode amplifier 93 and an inverting amplifier 90 compensating for the signal inversion by the amplifier 93.

The input/output voltage at the terminal 13, $v_{io}$, is fed back into the circuit at two points after filtering by the filter circuit 107. The filtered signal is fed directly into the summing amplifier 93 and after a simple inversion by an amplifier 108, fed into the summing amplifier 101. The feedback component into the amplifier 101 is also amplified by the amplifier 97 by a factor of $R_F/z_S$. Thus, the voltage at point 28 is given by $$Av_S + Kv_{io} = (R_F/z_S)V_s + (1-R_F/z_S)V_{io}.$$

This satisfies the relation required by the idealized circuit in FIG. 1 and the circuit in FIG. 4 now has an impedance given by the element 99, $z_S$. As explained for the circuits in the previous drawings, with the filter circuit 107 blocking signals of a certain frequency, the impedance of this circuit at this frequency is $R_F$.

Figure 7:
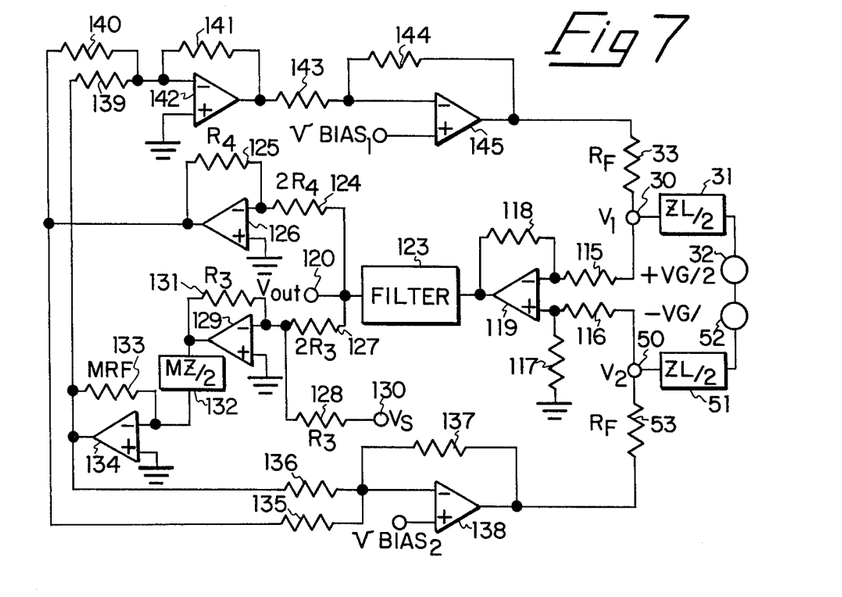
FIG. 7 shows a differential circuit having a voltage-controlled feedback loop for controlling the impedance of the circuit.

A differential version of the circuit shown in FIG. 6 is diagrammed in FIG. 7. The subscriber loop is connected to the pair of input/output terminals 30 and 50, which in the feedback loop lead to the input of an operational amplifier 119 connected in a purely differential manner. The input resistance elements 115 and 116 have the same value as a grounding resistance element 117 connected to the positive input of the amplifier 119 and a feedback resistance element 118 connected between the output of the amplifier and its negative input. The output of the amplifier 119 is simply the differential voltage at terminals 30 and 50, $v_1-v_2$. This voltage after being filtered by a subcircuit 123 is used for the transmission of signals from the subscriber loop to the external world. A terminal 120 is shown for this purpose.

The filtered feedback voltage is divided and modified into two different feedback components. An amplifier 126 simply divides the differential voltage by one-half to compensate for the differential gain of 2 in the circuit. This is accomplished by having the value of an input resistance element 124 double to that of a feedback resistance element 125. The halved voltage component is then fed into summing amplifiers 142 and 138, which respectively belong to the two legs of the differential circuit.

The second component is added to a received voltage signal, $v_S$, from a terminal 130. A summing amplifier 129 having equal resistance elements 128, and 131 and a resistance element 127 double that of element 128, accomplishes this. The summed voltage is then amplified by an amplifier 134 by a factor of $-2\,R_F/z_S$, which is accomplished by having input impedance element 132 having a scaled value of $Mz_S/2$ and a feedback resistance element 133 having an equally scaled value of $MR_F$. The amplified sum is then fed into the summing amplifier 142 through a resistance element 139 and to the summing amplifier 138 through a resistance element 136. The resistance elements 139, 140, and 141 for the amplifier 142 are equal; likewise, the resistance elements 135, 136, and 137 for amplifier 138 are equal.

The output of the amplifier 142 is inverted by an amplifier 145 having an input resistance element 143 equal to a feedback resistance element 144. The inversion of the output of amplifier 142 accomplishes a differentiation of the voltage signals to the terminal 30 with respect to the terminal 50. Also, the positive input of the amplifier 145 is biased as well as that for the amplifier 138 to keep the voltages operating in the circuit within the proper operating range of the amplifiers.

Thus, the output voltage for the amplifiers 145 and 138 is $$\frac{R_F}{z_S/2} v_S + \frac{1}{2}\left(1 - \frac{R_F}{z_S/2}\right)(v_1 - v_2)$$

or its negative. A comparison with output voltage of the amplifier 90 in FIG. 6 confirms that the circuit operates as desired.

As in the case for the differential current-controlled feedback circuit in FIG. 3, the circuit is suitable as an interface circuit to a subscriber loop. The circuit has only one impedance element 132, which needs to be matched to the subscriber loop. The element can be complex if need be. The rest of the circuit is well-suited for integrated circuit manufacture since it is composed of operational amplifiers and matched resistances. With the filter circuit 123 the circuit has one impedance, $z_S$, to audio signals and another impedance, $R_F$, for supplying a DC current to the subscriber loop. Common mode signals generate no differential signal between $v_1$ and $v_2$, and therefore no feedback signal.

As in the case of the differential current-controlled feedback circuit as in FIG. 4, external series resistors having value $R_X$ can be compensated for by modifying feedback resistance element 133 to have a value, $MR_F+MR_X$, instead of $MR_F$ and changing the element 132 to have a value $Mz_S/2-MR_x$, instead of $Mz_S/2$.

Accordingly, while the invention has been particularly shown and described with reference to preferred embodiments, it will be understood by those skilled in the art that the foregoing and other changes in form and details may be made therein without departing from the spirit of the invention. It is therefore intended that an exclusive right be granted to the invention as limited only by the metes and bounds of the appended claims.

What is claimed is:

1. An impedance control circuit for transferring a voltage signal from a signal source to a second circuit comprising
   first impedance means for connecting said source to said second circuit,
   means responsive to a signal current generated through said first impedance means for generating a feedback current proportional to said signal current,
   second impedance means responsive to said feedback current for generating a first feedback voltage signal related to said feedback current and further related to said signal current, and
   means connected between said source and said first impedance means for summing said first feedback voltage signal and said source voltage signal into an output signal to said first impedance means, said summed output signal generating said signal current through said first impedance means,
   whereby the impedance of said second impedance means with respect to the impedance of said first impedance means determines the impedance of said circuit.

2. A circuit as in claim 1 wherein said second impedance means comprises means for filtering out components of said first feedback voltage signal outside a predetermined frequency range whereby said control circuit has one impedance for signals within said predetermined frequency range determined by the impedance of said second impedance means with respect to the impedance of said first impedance means and another impedance for signals outside said predetermined frequency range determined by the impedance of said first impedance means.

3. A circuit as in claim 2 wherein said frequency range includes the range or audio frequencies and excludes DC frequency.

4. A circuit as in claim 1 wherein the impedance of said second impedance means minus said first impedance means defines substantially the impedance of said circuit.

5. A circuit as in claim 4 wherein said first impedance means is substantially resistive.

6. A circuit as in claim 1 wherein said feedback current generating means comprises a voltage-to-current conversion means for converting the voltage across said first impedance means to said feedback current proportional to said signal current by a factor, where said factor is determined by the product of the impedance of said first impedance means and the transconductance of said voltage-to-current converting means.

7. An impedance control circuit for transferring a first voltage signal from a signal source to a second circuit with a desired source impedance and receiving a second voltage signal from said second circuit with a desired termination impedance through an interface terminal comprising
   first impedance means connected to said interface terminal,
   means responsive to a signal current generated through said first impedance means and said interface terminal for generating a first feedback current proportional to said signal current by a first proportionality constant,
   second impedance means responsive to said feedback current for generating a first feedback voltage signal related to said feedback current and said signal current, and
   means for summing said first feedback voltage signal and a voltage signal proportional to said first voltage signal by a second proportionality constant into an output signal at an output terminal, said first impedance means connected between said summing means output terminal and said interface terminal so that the difference between said summed output signal and the voltage signal at said interface terminal generates said signal current,
   whereby the impedance of said second impedance means with respect to the impedance of said first impedance means and the values of said first and said second proportionality constants determine said desired source impedance and said desired termination impedance of said circuit.

8. A circuit as in claim 7 wherein said second impedance means comprises means for filtering out signal components of said first feedback voltage signal outside a predetermined frequency range whereby said source and termination impedances of said circuit are different for signals within said predetermined frequency range and for signals outside said predetermined frequency range.

9. A circuit as in claim 8 wherein said frequency range includes the range of audio frequencies and excludes the DC frequency.

10. A circuit as in claim 9 wherein the impedance of said second impedance divided by said first proportionality constant minus the impedance of said first impedance means defines substantially said desired source and termination impedances of said circuit, and said second proportionality constant defines a gain factor for said source signal.

11. A circuit as in claim 10 wherein said first impedance means is substantially resistive.

12. A circuit as in claim 11 wherein said feedback current generating means comprises a voltage-to-current conversion means for converting the voltage across said first impedance means to said feedback current proportional to said signal current by a factor, wherein said factor is determined by the product of the impedance of said first impedance means and the transconductance of said voltage-to-current converting means.

13. An impedance control circuit for transferring voltage signals from a signal source to a second circuit and receiving voltage signals from said second circuit through an interfacing terminal comprising first means for inverting a voltage signal at said terminal, second means for summing said inverted terminal voltage signal and said source voltage signal and amplifying said sum by a factor determined by the ratio of impedances of a first impedance means to a second impedance means, third means for summing and amplified summed voltage signals from said second means and said terminal voltage signal into an output signal at an output terminal, and a third impedance means connected between said third means output terminal and said interfacing terminal and having an impedance substantially equal to that of said first impedance means, whereby the impedance of said second impedance means is substantially the impedance of said circuit.

14. A circuit as in claim 13 comprising means for filtering out signal components of said terminal voltage signal outside a predetermined frequency range, said second and third means summing and amplifying said filtered terminal voltage signal, whereby said circuit has one impedance for signals within said predetermined frequency range determined by the impedance of said first impedance means and another impedance for signals outside said predetermined frequency range determined by the impedance of said third impedance means.

15. A circuit as in claim 14 wherein said second and third impedance means are substantially resistive.

16. A circuit as in claim 15 wherein said first, second and third means comprise operational amplifiers.

17. An impedance control circuit for transferring a voltage signal from a signal source to second circuit with a desired source impedance and receiving a voltage signal from said second circuit with a desired termination impedance at an interfacing terminal comprising first means responsive to the voltage signal at said interfacing terminal for amplifying said terminal voltage signal by a first proportionality factor, second means responsive to said source voltage signal for amplifying said source voltage signal by a second proportionality factor related to said first proportionality factor, third means for summing said amplified terminal voltage signal and said amplified source voltage signal into an output voltage signal at an output terminal, and a first impedance means connected between said third means output terminal and said interfacing terminal, whereby said first and second proportionality factors determine the desired source impedance and the desired termination impedance of said circuit.

18. A circuit as in claim 17 further comprising means for filtering out signal components of said terminal voltage to said first means outside a predetermined frequency range whereby said source and termination impedances of said circuit are different for signals within said predetermined frequency range and for signals outside said predetermined frequency range.

19. A circuit as in claim 18 wherein said frequency range includes the range of audio frequencies and excludes the DC frequency.

20. A circuit as in claim 17 wherein said control circuit is a differential circuit.

21. A subscriber line interface circuit for transferring voltage signals from a signal source to a subscriber line loop with a desired source impedance and receiving voltage signals from said subscriber line loop with a desired termination impedance, comprising a pair of terminals for connection to said subscriber line loop, a pair of first impedance means each having first and second terminals, each first terminal respectively connected to one of said pair of terminals, a pair of feedback means each respectively responsive to a first current flowing through each one of said pair of first impedance means for generating first and second feedback currents proportional to said first current by a first proportionality constant, second impedance means responsive to said first and second feedback currents for generating a first feedback voltage signal proportional to the sum of said first and second feedback currents, first amplifier means for amplifying said first feedback voltage signal by a first predetermined factor to generate a second feedback voltage signal, means for summing a voltage signal proportional to said source voltage signal by a second proportionality constant, said first feedback voltage signal and said second feedback voltage signal, means for transferring said summed voltage signals to a second terminal of one of said pair of first impedance means, means for generating the negative of said summed voltage signals and transferring the negative of said summed voltage signals to a second end of the other of said pair of first impedance means to generate said first current, whereby the impedance of said second impedance means, the impedance of said pair of first impedance means, the values of said first and second proportionality constants and said first factor in the form of a mathematical product determine said desired source impedance and said desired termination impedance of said circuit.

22. A circuit as in claim 21 further comprising means for filtering out components of said first feedback voltage signal outside a predetermined frequency range whereby the desired source and termination impedances are different for signals within said predetermined frequency range and for voltage signals outside said predetermined frequency range.

23. A circuit as in claim 22 further comprising bias means for supplying a first bias voltage to said summing means and for supplying a second bias voltage to said negative impressing means that the difference in said bias voltages generates a direct current flow through said subscriber line loop.

24. A circuit as in claim 21 wherein said summing means comprises first and second summing amplifiers, each summing said voltage signal proportional to said source voltage signal, said first feedback voltage signal and said second feedback voltage signal, the summed voltage signals from said first summing amplifier impressed upon the second end of the other of said pair of first impedance means.

25. A circuit as in claim 21 wherein said first proportionality constant and the impedance of said second impedance means are determined such that said first feedback voltage is substantially equal to the voltage generated by the flow of said first current through one of said pair of first impedance means.

26. A circuit as in claim 21 wherein said first factor is determined such that said second feedback voltage signal is substantially equal to the product of said first current and said desired termination impedance.

27. A circuit as in claim 26 wherein said second proportionality constant is substantially equal to two and said desired source impedance and termination impedance are substantially equal.

28. A subscriber line interface circuit for transferring voltage signals from a signal source to a subscriber line loop with a desired source impedance and receiving voltage signals from said subscriber line loop with a desired termination impedance, with a pair of external series resistors between said subscriber line interface circuit and said subscriber loop, comprising
a pair of terminals for connection to said subscriber line loop through said pair of external series limiting resistors,
a pair of first impedance means each having first and second terminals, each first terminal respectively connected to one of said pair of terminals,
a pair of feedback means each respectively responsive to a first current flowing through each one of said pair of first impedance means for generating first and second feedback currents proportional to said first current by a first porportionality constant,
second impedance means responsive to of said first and second feedback currents for generating a first feedback voltage signal,
first amplifier means for amplifying said first feedback voltage signal by a first predetermined factor related to said desired impedance to generate a second feedback voltage signal,
second amplifier means for amplifying said first feedback voltage signal by a second predetermined factor related to the values of said external series resistors to generate a third feedback voltage signal.

means for summing a voltage signal proportional to said source voltage signal by a second proportionality constant, said second feedback voltage signal, and said third feedback voltage sginal into a summed output voltage signal at a first output terminal connected to a second terminal of one of said pair of first impedance means,
means responsive to a signal from said summing means for generating the negative of said summed voltage signal at a second output terminal connected to a second terminal of the other of said pair of first impedance means,
whereby the impedance of said second impedance means, impedance of said pair of first impedance means, said first and second proportionality constants, said first and second factors in the form of a mathematical product determine said desired source impedance and said desired termination impedance of said circuit.

29. A circuit as in claim 28 further comprising means for filtering out components of said first feedback voltage signal outside a predetermined frequency range whereby the desired source and termination impedances are different for signals within said predetermined frequency range and for voltage signals outside said predetermined frequency range.

30. A circuit as in claim 29 further comprising bias means for supplying a first bias voltage to said summing means in such a manner that said first bias voltage is coupled to said summed output voltage signal and for supplying a second bias voltage to said negative generating means in such a manner that said second bias voltage is coupled to said negative of said summed output voltage signal whereby said bias voltages generate a direct current flows through said subscriber loop.

31. A circuit as in claim 28 wherein said summing means comprises first and second summing amplifiers, each summing said voltage signal proportional to said source voltage signal, said second feedback voltage signal and said third feedback voltage signal into a summed output signal, the summed output signal from said first summing amplifier to said first output terminal, the summed output signal from said second summing amplifier to said negative generating means, said negative generating means comprising an operational amplifier in an inverting mode, having an output terminal connected to said second output terminal.

32. A circuit as in claim 28 wherein said first factor is determined such that said second feedback voltage signal is substantially equal to the product of said first current and said desired termination impedance.

33. A circuit as in claim 32 wherein said second proportionately constant is substantially equal to two and said desired source impedance and termination impedance are substantially equal.

34. A subscriber line interface circuit for transferring voltage signals from a signal source to subscriber line loop with a desired source impedance and receiving voltage signals from said subscriber line loop with a desired termination impedance, comprising
a pair of terminals for connection to said subscriber line loop,
a pair of first impedance means each having first and second terminals, each first terminal respectively connected to one of said pair of terminals,
first amplifier means responsive to the voltage signals at said pair of terminals for generating a differential voltage signal, second amplifier means responsive to said differential voltage signal for generating a first feedback voltage signal proportional to said differential voltage signal by a first predetermined constant, third amplifier means responsive to said differential volage signal and said source voltage signal for generating a second feedback voltage signal proportional by a second predetermined constant to the sum of said source voltage signal and a voltage signal proportional by a third predetermined constant to said differential voltage signal, means for summing said first feedback voltage signal and said second feedback voltage signal into a summed output signal at a first output terminal connected to a second terminal of one of said pair of impedance means, and means responsive to a summed output signal from said summing means for generating the negative of said summed voltage signal at a second output terminal connected to a second terminal of the other of said pair of first impedance means, whereby the impedance of said first impedance means, and first, second and third proportionality constants in the form of a mathematical product determine said desired source and said desired termination impedances.

35. A circuit as in claim 34 wherein first amplifier means comprises means for filtering out components of said differential volage signal outside a predetermined frequency range whereby said source and termination impedances of said circuit are different for signals within said predetermined frequency voltage and for signals outside said predetermined frequency range.

36. The circuit as in claim 35 wherein said desired source and termination impedances are substantially equal, with said first and third predetermined constants substantially equal to negative one-half and said second predetermined constant is substantially equal to the negative of twice the ratio of said first impedance means over said desired source impedance.

37. The circuit as in claim 36 further comprising a pair of external series resistors between said pair of terminals and said subscriber line loop, wherein said second proportionality constant is substantially equal to the negative of the ratio of the sum of said first impedance means and said external series resistor over the difference between said desired source impedance and said external series resistor, whereby said pair of external series resistors is compensated for.

38. The circuit as in claim 35 further comprising bias means for supplying a first bias voltage to said summing means in such a manner that said first bias voltage is coupled to said summed output voltage and for supplying a second bias voltage to said negative generating means in such a manner that said second bias voltage is coupled to said negative summed output signal whereby said bias voltages generate a direct current flow through said subscriber line loop.

* * * * *